United States Patent
Wehlus

(10) Patent No.: US 10,312,290 B2
(45) Date of Patent: Jun. 4, 2019

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventor: Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 109 days.

(21) Appl. No.: 15/113,478

(22) PCT Filed: Jan. 22, 2015

(86) PCT No.: PCT/EP2015/051217
§ 371 (c)(1),
(2) Date: Jul. 22, 2016

(87) PCT Pub. No.: WO2015/110513
PCT Pub. Date: Jul. 30, 2015

(65) Prior Publication Data
US 2017/0005141 A1    Jan. 5, 2017

(30) Foreign Application Priority Data

Jan. 22, 2014  (DE) .................. 10 2014 100 680

(51) Int. Cl.
*H01L 27/28*    (2006.01)
*H01L 27/32*    (2006.01)
(Continued)

(52) U.S. Cl.
CPC .............. *H01L 27/288* (2013.01); *G02B 6/43* (2013.01); *H01L 27/3227* (2013.01);
(Continued)

(58) Field of Classification Search
CPC ........ H01L 51/50–51/56; H01L 27/288; H01L 51/5268; H01L 27/3227; G02B 6/43
See application file for complete search history.

(56) References Cited

U.S. PATENT DOCUMENTS

2004/0031966 A1* 2/2004 Forrest .................... H01L 27/30
257/79
2011/0222309 A1* 9/2011 Shinohara ............ G02B 6/0018
362/560
(Continued)

FOREIGN PATENT DOCUMENTS

DE    102012220056 A1    2/2014
DE    102012220049 A1    5/2014
(Continued)

OTHER PUBLICATIONS

Lin et al. (2006). Integration of polymer light-emitting diode and polymer waveguide on Si substrate. Applied Physics Letters, 89(6), 063501. doi:10.1063/1.2219718.*
(Continued)

*Primary Examiner* — Lauren R Bell
(74) *Attorney, Agent, or Firm* — Viering, Jentschura & Partner MBB

(57) ABSTRACT

Various embodiments may relate to an optoelectronic component, including an optoelectronic structure formed for providing an electromagnetic radiation, a measuring structure formed for measuring the electromagnetic radiation, and a waveguide formed for guiding the electromagnetic radiation. The optoelectronic structure and the measuring structure are optically coupled to the waveguide. The waveguide includes scattering centers distributed in a matrix, wherein the scattering centers are distributed in the matrix in such a way that part of the electromagnetic radiation is guided from the optoelectronic structure to the measuring structure.

12 Claims, 5 Drawing Sheets

(51) Int. Cl.
  *H01L 51/44* (2006.01)
  *H01L 31/0232* (2014.01)
  *H01L 31/16* (2006.01)
  *G02B 6/43* (2006.01)
  *H01L 51/52* (2006.01)

(52) U.S. Cl.
  CPC ........ *H01L 31/02327* (2013.01); *H01L 31/16* (2013.01); *H01L 51/44* (2013.01); *H01L 51/5268* (2013.01)

(56) References Cited

U.S. PATENT DOCUMENTS

| | | |
|---|---|---|
| 2015/0270313 A1 | 9/2015 | Popp et al. |
| 2015/0318430 A1 | 11/2015 | Schicktanz et al. |
| 2015/0349027 A1 | 12/2015 | Schicktanz et al. |
| 2016/0148987 A1 | 5/2016 | Popp et al. |

FOREIGN PATENT DOCUMENTS

| | | |
|---|---|---|
| DE | 102012222461 A1 | 6/2014 |
| DE | 102012222463 A1 | 6/2014 |
| DE | 102013201217 A1 | 7/2014 |
| DE | 102013105228 A1 | 11/2014 |
| DE | 102013105229 A1 | 11/2014 |
| JP | 2010049811 A | 3/2010 |
| JP | 2010087245 A | 4/2010 |
| WO | 2010090600 A1 | 8/2010 |

OTHER PUBLICATIONS

Yuan-Yu Lin et al.; Integration of polymer light-emitting diode and polymer waveguide on Si substrate; Applied Physics Letters; American Institute of Physics US Bd. 89, Nr. 6; Aug. 7, 2006.

International Search Report based on application No. PCT/EP2015/051217 (5 pages+3 pages English translation) dated Jun. 1, 2015 (for reference purpose only).

German Search Report based on application No. 10 2014 100 680.1 (7 pages) dated Jan. 15, 2015 (for reference purpose only).

\* cited by examiner

OPTOELECTRONIC COMPONENT AND METHOD FOR PRODUCING AN OPTOELECTRONIC COMPONENT

RELATED APPLICATIONS

The present application is a national stage entry according to 35 U.S.C. § 371 of PCT application No.: PCT/EP2015/051217 filed on Jan. 22, 2015, which claims priority from German application No.: 2014 100 680.1 filed on Jan. 22, 2014, and is incorporated herein by reference in its entirety.

TECHNICAL FIELD

In various embodiments, an optoelectronic component and a method for producing an optoelectronic component are provided.

BACKGROUND

Organic light emitting diodes (OLEDs) are being increasingly widely used in general lighting, for example as large-area luminous surfaces (surface light source). A conventional OLED includes on a substrate an anode and a cathode with an organic functional layer system between the anode and cathode. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow. The OLED emission can easily be varied via the operating current of the OLED. Adaptation to external and internal light conditions is possible as a result.

The external light conditions can change (short-term process) e.g. if the OLED in a room with a window is exposed to the diurnally variable sunlight. Furthermore, the emitted wavelength spectrum of the OLED is subjected to aging processes (long-term process), such that, depending on the OLED layer construction and processing, the luminance typically decreases with time. The decrease in the luminance is brought about e.g. by increased current densities or temperatures which occur during the operation of the OLED and can damage the organic system. In order to keep constant the luminance in the environment of the OLED surface light source with time, the luminance in the OLED-illuminated room can be kept constant by means of manual dimming or external switched-on sensors with electronic circuit.

In one conventional method, sensors are applied to the OLED and collect the light of the OLED. In that case, however, the sensors are conventionally positioned such that they can observe only partial regions of the OLED, for example the edge or the region directly around the sensor. If, in the case of an OLED on a glass substrate, for example, the sensor is applied at the edge in order to measure the light propagating in the substrate, the light which reaches the sensor comes only from a region having a maximum width of 10 mm at the edge of the OLED. The remaining light emitted by the OLED and guided in the glass substrate is absorbed on the way to the sensor in the organic functional layer structure.

SUMMARY

In various embodiments, an optoelectronic component and a method for producing an optoelectronic component are provided which make it possible to determine the color and brightness of the entire light emitted by the OLED in an integrated way during the operation of the OLED.

In various embodiments, an optoelectronic component is provided, the optoelectronic component including: an optoelectronic structure formed for providing an electromagnetic radiation; and a measuring structure formed for measuring the electromagnetic radiation; and a waveguide formed for guiding the electromagnetic radiation, wherein the optoelectronic structure and the measuring structure are optically coupled to the waveguide; wherein the waveguide includes scattering centers distributed in a matrix, wherein the scattering centers are distributed in the matrix in such a way that part of the electromagnetic radiation is guided from the optoelectronic structure to the measuring structure.

In one configuration, the optoelectronic component can be formed as a surface component.

In one configuration, the optoelectronic component can be formed as an organic optoelectronic component, for example as an organic photodetector, an organic solar cell and/or an organic light emitting diode.

In one configuration, the optoelectronic structure, the measuring structure and/or the waveguide can be formed as a layer stack.

In one configuration, the optoelectronic structure may include a first electrode, a second electrode and an organic functional layer structure between the first electrode and the second electrode, wherein the organic functional layer structure is formed for converting an electric current into an electromagnetic radiation and/or for converting an electromagnetic radiation into an electric current.

In one configuration, the measuring structure may include a third electrode, a fourth electrode and a second organic functional layer structure between the third electrode and the fourth electrode, wherein the second organic functional layer structure is formed for converting an electromagnetic radiation into an electric current or voltage.

In one configuration, the third electrode can have the same structure as the first electrode, for example can be formed as one electrode.

In one configuration, the fourth electrode can have the same structure as the second electrode, for example can be formed as one electrode.

In one configuration, the second organic functional layer structure can have the same structure as the organic functional layer structure of the optoelectronic structure, for example can be formed as one organic functional layer structure.

In one configuration, the optoelectronic component may furthermore include a coupling-out structure in the beam path of the electromagnetic radiation in the waveguide and the measuring structure, for example in the region of the measuring structure in the waveguide, wherein the coupling-out structure is formed in such a way that at least part of the electromagnetic radiation that can be guided in the waveguide is diverted into the measuring structure.

In one configuration, the coupling-out structure may include a mirror structure or be formed in this way, wherein the mirror structure is at least reflective for at least part of the electromagnetic radiation guided in the waveguide.

In one configuration, the coupling-out structure may include scattering centers distributed in a matrix, for example in accordance with one of the configurations of the core of the waveguide.

In one configuration, the coupling-out structure can be formed in such a way that the proportion and/or the type of scattering centers in the waveguide are/is different in the region of the measuring structure than in the region of the optoelectronic structure, for example more highly scattering.

In one configuration, the coupling-out structure can be formed with or include a structured interface of the waveguide. The structured interface can be formed for example by means of roughening one of the interfaces or forming a pattern at one of the interfaces of the waveguide and/or the measuring structure.

In one configuration, the coupling-out structure may include a microlens array or be formed in this way. The microlenses and/or the interface roughness can act as scattering centers, for example for increasing the coupling-in/out of light.

In one configuration, the coupling-out structure can be formed as or include an optical grating, wherein the grating includes a structured layer having regions having a low refractive index.

In one configuration, the waveguide can be formed as a covering body of the optoelectronic structure and/or of the measuring structure. The covering body can be for example a carrier, a hermetically impermeable substrate and/or an encapsulation structure.

In one configuration, the optoelectronic structure and the measuring structure can be arranged alongside one another on the waveguide.

In one configuration, the measuring structure can be arranged laterally with respect to the optoelectronic structure, for example laterally on the waveguide.

In one configuration, the scattering centers can have a difference in the refractive index with respect to the electromagnetic radiation in relation to the refractive index of the matrix of greater than approximately 0.05.

In one configuration, the waveguide may include a core and a cladding, wherein the cladding covers the core along the direction of propagation of the electromagnetic radiation, and wherein the core includes the matrix and the scattering centers.

In one configuration, the cladding can be at least translucent with respect to the electromagnetic radiation.

In one configuration, the optoelectronic structure and/or the measuring structure may include a covering body, wherein the covering body is formed at least as a part of the waveguide, for example as at least one part of the cladding of the waveguide. A covering body is formed for covering the measuring structure and/or the optoelectronic structure. A covering body can be or include for example a carrier, a hermetically impermeable substrate, a covering or an encapsulation structure.

In one configuration, the scattering centers can be formed as particles.

In one configuration, the scattering centers may include or be formed from an inorganic substance or an inorganic substance mixture.

In one configuration, the scattering centers may include or be formed from a substance, a substance mixture or a stoichiometric compound composed of/including one of the following substances: $TiO_2$, $CeO_2$, $Bi_2O_3$, $ZnO$, $SnO_2$, $Al_2O_3$, $SiO_2$, $Y_2O_3$, $ZrO_2$, phosphors, colorants, and glass particles, metallic nanoparticles.

In one configuration, the scattering centers can be formed as cavities.

In one configuration, the scattering centers can have a curved surface, for example in a manner similar or identical to an optical lens.

In one configuration, the scattering centers can have one of the following geometrical shapes and/or a part of one of the following geometrical shapes: spherical, aspherical, for example prismatic, ellipsoid, hollow, laminar or rod-shaped.

In one configuration, the scattering centers can have an average diameter in a range of approximately 0.02 µm to approximately 10 µm, for example in a range of approximately 0.1 µm to approximately 1 µm.

In one configuration, the waveguide may include at least a first type of scattering centers and a second type of scattering centers, wherein the first type and the second type of scattering centers differ in at least one property, for example in the average dimensioning of the scattering centers, the shape and/or the refractive index with respect to the electromagnetic radiation.

In one configuration, the scattering centers can have a homogeneous distribution at least in a region of the waveguide, for example in each case in the waveguide in the region of the measuring structure and/or the optoelectronic structure.

In one configuration, the scattering centers can be distributed in the waveguide in a structured fashion.

In one configuration, the waveguide may include a first region having a first concentration of scattering centers and at least one second region having a second concentration of scattering centers. The first concentration can be different, for example higher, than the second concentration. By way of example, the first concentration may include a multiple of the second concentration in a range of approximately 0.1 to approximately 10, for example in a range of approximately 0.5 to 2.

In one configuration, the waveguide may include a first region having a first distribution of scattering centers and a second region having a second distribution of scattering centers. By way of example, the first distribution can be a homogeneous distribution of scattering centers and the second distribution can be a scattering center concentration having a gradient.

In one configuration, the first region and the at least one second region can be arranged one above another or alongside one another in the waveguide. By way of example, a first region can be in the region of the measuring structure in the waveguide and at least one second region can be in the region of the optoelectronic structure in the waveguide, wherein the first region has for example a higher density of scattering centers than the second region, that is to say that, for example in the case of a homogeneous distribution of the scattering centers in the first region and in the second region, the first region has a higher concentration of scattering centers than the second region.

In one configuration, the matrix can have with respect to the electromagnetic radiation a refractive index of greater than approximately 1.7.

In one configuration, the matrix can formed in an amorphous fashion.

In one configuration, the matrix may include or be formed from a molding material and/or a potting material.

In one configuration, the matrix may include or be formed from a substance or a substance mixture from one of the following glass systems: PbO-containing systems, for example $PbO-B_2O_3$, $PbO-SiO_2$, $PbO-B_2O_3-SiO_2$, $PbO-B_2O_3-ZnO_2$, $PbO-B_2O_3-Al_2O_3$; and/or $Bi_2O_3$-containing systems, for example $Bi_2O_3-B_2O_3$, $Bi_2O_3-B_2O_3-SiO_2$, $Bi_2O_3-B_2O_3-ZnO$, $Bi_2O_3-B_2O_3-ZnO-SiO_2$.

In one configuration, the matrix may include or be formed from a substance or a substance mixture from one of the following substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides.

In one configuration, the matrix may include or be formed from a substance or a substance mixture from the group of substances: Ce, Fe, Sn, Ti, Pr, Eu and/or V compounds.

In one configuration, the substance or the substance mixture of the matrix can be liquefiable at a temperature to a maximum of approximately 600° C.

In one configuration, the matrix may include or be formed from one of the following substances: a silicone, for example a polydimethylsiloxane, polydimethyl-siloxane/polydiphenylsiloxane and/or a derivative thereof; a silazane, an epoxy, a polyacrylate, a polycarbonate or the like, for example a silicone hybrid, a silicone-epoxy hybrid.

In one configuration, the optoelectronic component can be formed in such a way that the major portion of the electromagnetic radiation can be coupled out from the optoelectronic component.

In one configuration, the scattering centers can be formed and/or distributed in the matrix in such a way that the average free path length of the electromagnetic radiation relative to the thickness of the waveguide is in a ratio of approximately 0.1 to approximately 10.0.

In various embodiments, a method for producing an optoelectronic component is provided, the method including: providing at least one part of a waveguide formed for guiding an electromagnetic radiation; forming an optoelectronic structure for providing the electromagnetic radiation; and forming a measuring structure for measuring the electromagnetic radiation; wherein the optoelectronic structure and the measuring structure are formed in a manner optically coupled to the waveguide; wherein the waveguide includes scattering centers distributed in a matrix, wherein the scattering centers are distributed in the matrix in such a way that part of the electromagnetic radiation is guided from the optoelectronic structure to the measuring structure.

In various configurations, the method for producing an optoelectronic component may include features of the optoelectronic component; and the optoelectronic component may include features of the method for producing an optoelectronic component, insofar as they are expediently applicable in each case.

In various configurations, forming the waveguide may include glass melting. A process of glass melting can be understood to mean a thermal liquefaction, i.e. melting, of a glass. After the glass melting process, the glass can be powdered, applied to a carrier in the form of coatings and subsequently vitrified by means of a thermal treatment.

In one configuration of the method, the measuring structure can be formed simultaneously with the optoelectronic structure, for example from the same layer structure.

In one configuration, the scattering centers can be distributed in the waveguide in a structured fashion, such that the waveguide includes a first region having a first concentration and/or first distribution of scattering centers and at least one second region having a second concentration and/or second concentration of scattering centers. By way of example, the waveguide can be formed in a structured fashion or can be structured after being formed. Forming in a structured fashion can be carried out for example by means of screen printing with a mask process. The waveguide can be hardened for example after the first region and the second region have been arranged by means of mask processes. As a result, it is possible for example to prevent an optical interface, for example an air gap, from being formed between the first region and the second region. Structuring the waveguide into a first region and at least one second region after forming the waveguide can be carried out for example by means of forming scattering centers by means of laser internal engraving.

BRIEF DESCRIPTION OF THE DRAWINGS

The invention is explained in greater detail below on the basis of an exemplary embodiment, wherein also as before no distinction will be drawn specifically among the claim categories and the features in the context of the independent claims are intended also to be disclosed in other combinations. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

DETAILED DESCRIPTION

Figure 1:
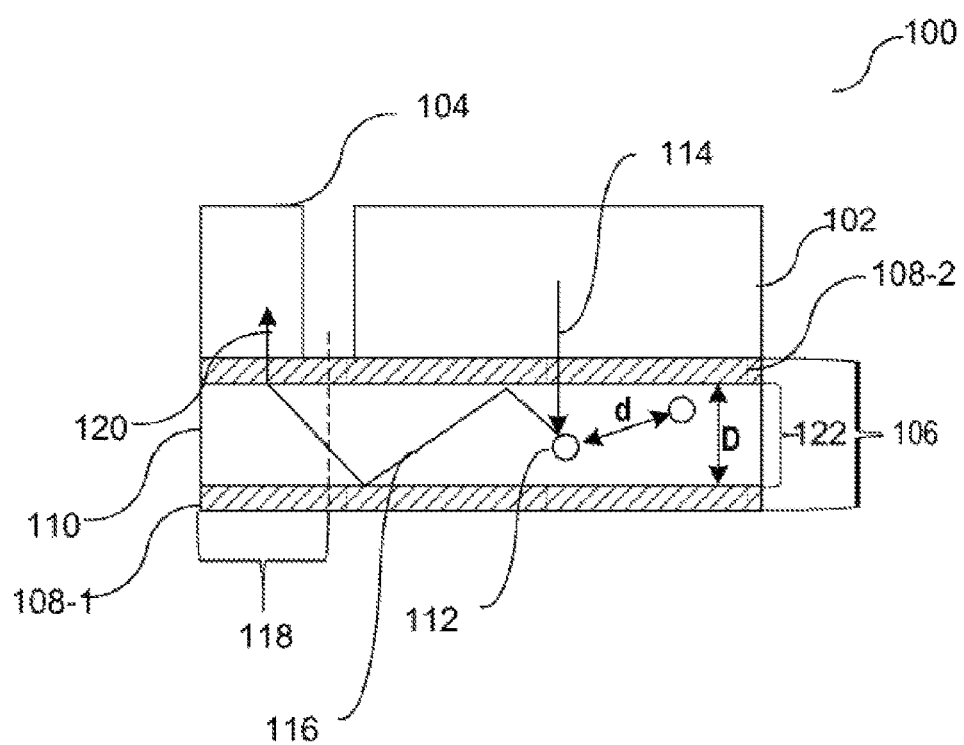
FIG. 1 shows a schematic illustration of an optoelectronic component in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components and optoelectronic structures are described. The following description of the optoelectronic structure analogously applies to an optoelectronic component, and vice versa.

An optoelectronic structure includes an optically active region or can be an optically active region. The optically active region can emit electromagnetic radiation by means of a voltage applied to the optically active region. In various embodiments, the optoelectronic structure can be formed in such a way that the electromagnetic radiation has a wavelength range including X-ray radiation, UV radiation (A-C), visible light and/or infrared radiation (A-C).

In various configurations, the optically active region, for example an electromagnetic radiation emitting structure, can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The electromagnetic radiation emitting component can be formed for example as a light emitting diode (LED), as an organic light emitting diode (OLED), as a light emitting transistor or as an organic light emitting transistor, for example an organic field effect transistor (OFET) and/or an organic electronic system. The organic field effect transistor can be a so-called "all-OFET", in which all the layers are organic. In various configurations, the electromagnetic radiation emitting structure can be part of an integrated circuit. Furthermore, a plurality of electromagnetic radiation emitting structures can be provided, for example in a manner accommodated in a common housing. An optoelectronic structure may include an organic functional layer system, which is synonymously also designated as organic functional layer structure. The organic functional layer structure may include or be formed from an organic substance or an organic substance mixture which is designed for example for emitting an electromagnetic radiation from an electric current provided.

An optoelectronic component in the form of an organic light emitting diode can be formed as a so-called top emitter and/or a so-called bottom emitter. In the case of a bottom emitter, electromagnetic radiation is emitted from the electrically active region through the carrier. In the case of a top emitter, electromagnetic radiation is emitted from the top side of the electrically active region and not through the carrier.

A top emitter and/or bottom emitter can also be formed as optically transparent or optically translucent; by way of example, each of the layers or structures described below can be or be formed as transparent or translucent with respect to the absorbed or emitted electromagnetic radiation.

A planar optoelectronic structure including two planar, optically active sides can be formed for example as transparent or translucent in the connection direction of the optically active sides, for example as a transparent or translucent organic light emitting diode. A planar optoelectronic structure can also be referred to as a plane optoelectronic structure.

The first electrode, the second electrode and the organic functional layer structure of the optoelectronic structure can be formed in each case over a large area. As a result, the optoelectronic structure can have a continuous luminous area which is not structured into functional partial regions, for example a luminous area segmented into functional regions or a luminous area formed by a multiplicity of pixels.

Emission or absorption of electromagnetic radiation from the optoelectronic component over a large area can be made possible as a result. In this case, "large area" can mean that the optically active side has an area, for example a continuous area, for example of greater than or equal to a few square millimeters, for example greater than or equal to one square centimeter, for example greater than or equal to one square decimeter. For example, the optoelectronic structure can have just a single continuous luminous area which is brought about by the large-area and continuous formation of the electrodes and of the organic functional layer structure.

In various embodiments, the term "translucent" or "translucent layer" can be understood to mean that a layer or structure is transmissive to light, for example to the light generated by a light emitting optoelectronic structure, for example in one or more wavelength ranges, for example to light in a wavelength range of visible light (for example at least in a partial range of the wavelength range of 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of 380 nm to 780 nm), wherein light coupled into a structure (for example a layer) is also coupled out from the structure (for example layer) without scattering or light conversion.

In various embodiments, a waveguide can also be designated as light guide, light guiding fiber, optical waveguide, optical fiber and/or a beam guide. By way of example, the waveguide may include fibers, a tube or a rod, through which the electromagnetic radiation can be transported across a distance. Furthermore, the waveguide can be formed as planar optical waveguide structures (POW). Furthermore, the waveguide can be formed in the form of a bar, a lamina, a square, a cube, a hollow cylinder or other, similar geometric figures. The waveguide may include glass fibers and/or be designated as a fiber-optic cable. The waveguide may include for example plastic, such as, for example, polymeric fibers, PMMA, polycarbonate and/or hard clad silica.

In various embodiments, the waveguide is a guide for guiding electromagnetic radiation. The waveguide can be a component which is designed to be transparent or at least substantially translucent to electromagnetic radiation. A substantially transparent waveguide can have for example a transmission of incident electromagnetic radiation of greater than approximately 90%. A waveguide can have for example an elongate, for example planar, shape, for example dimensioning, for example can be formed such that it is very much longer or very much shorter in one spatial direction than in at least one other spatial direction. The waveguide may include a core having a cladding at least along the direction of propagation of the electromagnetic radiation. The cladding has a different refractive index than the core. By way of example, the cladding can also be an air layer.

The waveguiding of electromagnetic radiation can take place in the waveguide for example on the basis of internal reflection at the interface between the cladding and the core on account of a higher refractive index of the core than the refractive index of the surrounding cladding. The internal reflection can be designed as total internal reflection and/or by means of a reflective coating of the interface between the cladding and the core.

In various embodiments, an optoelectronic component 100 includes an optoelectronic structure 102 and a measuring structure 104—for example illustrated in FIG. 1.

The optoelectronic component 100 can be formed for example as a surface component. Additionally or alternatively, the optoelectronic component can be formed as an organic optoelectronic component, for example as an organic photodetector, an organic solar cell and/or an organic light emitting diode.

The optoelectronic structure 102 is formed for providing an electromagnetic radiation 114. The optoelectronic structure 102 may include for example a first electrode, a second electrode and an organic functional layer structure between the first electrode and the second electrode. The organic functional layer structure can be formed for converting an electric current into an electromagnetic radiation and/or for converting an electromagnetic radiation into an electric current. Further configurations of the optoelectronic structure 102 are described below, for example in the description of FIG. 3.

The measuring structure 104 is formed for measuring the electromagnetic radiation 114, 120.

In various embodiments, the measuring structure 104 can be a conventional photodiode or a conventional photodetector.

In various embodiments, the measuring structure 104 may include for example a third electrode, a fourth electrode and a second organic functional layer structure between the third electrode and the fourth electrode, wherein the second organic functional layer structure is formed for converting an electromagnetic radiation into an electric current. The third electrode can have for example the same structure as the first electrode, for example can be formed as one electrode. Additionally or alternatively, the fourth electrode can have the same structure as the second electrode, for example can be formed as one electrode. Additionally or alternatively, the second organic functional layer structure can have the same structure as the organic functional layer structure of the optoelectronic structure, for example can be formed as one organic functional layer structure.

Furthermore, the optoelectronic component 100 includes a waveguide 106. The waveguide 106 is formed for guiding the electromagnetic radiation 116. The optoelectronic structure 102 and the measuring structure 104 are optically coupled to the waveguide 106.

In various embodiments, the waveguide 106 may include a core 122 and a cladding 108, wherein the cladding 108 covers the core 122 along the direction of propagation of the electromagnetic radiation 116.

In one embodiment, the optoelectronic structure and/or the measuring structure may include a covering body, wherein the covering body is formed at least as a part of the waveguide, for example as at least one part of the cladding of the waveguide. The covering body can be for example a carrier, a hermetically impermeable substrate and/or an encapsulation structure.

The waveguide 106 includes scattering centers 112 distributed in a matrix 110. The scattering centers 112 can have a homogeneous distribution at least in one region of the waveguide 106. In one embodiment, the core 122 of the waveguide 106, in which the electromagnetic radiation 116 is at least partly guided, may include or be formed from the matrix 110 and the scattering centers 112.

The core 120 can have for example a thickness D in a range of approximately 300 nm to approximately 50 µm.

By way of example, the scattering centers 112 can be arranged or distributed in the matrix 110 in such a way, and the core 122 can be formed with respect to the cladding 108 in such a way, that electromagnetic radiation 116 is guided as far as the measuring structure 104.

In one embodiment, the scattering centers 112 can have a difference in the refractive index with respect to the electromagnetic radiation in relation to the refractive index of the matrix 110 of greater than approximately 0.05.

The scattering centers 112 can be formed for example as particles. Particulate scattering centers 112 may include or be formed from an inorganic substance or an inorganic substance mixture. By way of example, the scattering centers 112 may include or be formed from a substance, substance mixture or a stoichiometric compound from one of the following substances: $TiO_2$, $CeO_2$, $Bi_2O_3$, $ZnO$, $SnO_2$, $Al_2O_3$, $SiO_2$, $Y_2O_3$, $ZrO_2$, phosphors, colorants, and glass particles, metallic nanoparticles.

Alternatively or additionally, the scattering centers 112 can be formed as cavities.

The scattering centers 112 can have a curved surface, for example in a manner similar or identical to an optical lens. The scattering centers 112 can have one of the following geometrical shapes and/or a part of one of the following geometrical shapes: spherical, aspherical, for example prismatic, ellipsoid, hollow, laminar or rod-shaped. The scattering centers 112 can have an average diameter in a range of approximately 0.02 µm to approximately 10 µm, for example in a range of approximately 0.1 µm to approximately 1 µm.

The scattering centers 112 can be distributed in the waveguide for example in a structured fashion. For example, the waveguide 106 may include a first region having a first concentration of scattering centers 112 and at least one second region having a second concentration of scattering centers 112. The first concentration can be different, for example higher, than the second concentration. Alternatively or additionally, the waveguide 106 may include a first region having a first distribution of scattering centers 112 and a second region having a second distribution of scattering centers 112. By way of example, the first distribution can be a homogeneous distribution of scattering centers 112 and the second distribution can be a scattering center concentration having a gradient.

The first region and the at least one second region can be arranged one above another or alongside one another in the waveguide. By way of example, a first region can be in the region of the measuring structure 104 in the waveguide 106 and at least one second region can be in the region of the optoelectronic structure 102 in the waveguide 106, wherein the first region has for example a higher density of scattering centers 112 than the second region, that is to say that, for example in the case of a homogeneous distribution of the scattering centers 112 in the first region and in the second region, the first region has a higher concentration of scattering centers than the second region.

In one embodiment, the waveguide 106 may include at least a first type of scattering centers 112 and a second type of scattering centers 112, wherein the first type and the second type of scattering centers differ in at least one property, for example in the average dimensioning of the scattering centers, the shape and/or the refractive index with respect to the electromagnetic radiation.

The matrix 110 can have with respect to the electromagnetic radiation 114, 116 a refractive index of greater than approximately 1.7. The matrix can be formed for example in an amorphous fashion.

In various embodiments, the matrix 110 may include or be formed from a molding material and/or a potting material. In one embodiment, the matrix may include or be formed from a substance or a substance mixture from one of the following glass systems: PbO-containing systems, for example PbO—$B_2O_3$, PbO—$SiO_2$, PbO—$B_2O_3$—$SiO_2$, PbO—$B_2O_3$—$ZnO_2$, PbO—$B_2O_3$—$Al_2O_3$; and/or $Bi_2O_3$— containing systems, for example $Bi_2O_3$—$B_2O_3$, $Bi_2O_3$—$B_2O_3$—$SiO_2$, $Bi_2O_3$—$B_2O_3$—$ZnO$, $Bi_2O_3$—$B_2O_3$—$ZnO$—$SiO_2$. Alternatively or additionally, the matrix 110 may include or be formed from a substance or a substance mixture from one of the following substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides. Alternatively or additionally, the matrix 110 may include or be formed from a substance or a substance mixture from the group of substances: Ce, Fe, Sn, Ti, Pr, Eu and/or V compounds.

In one embodiment, the substance or the substance mixture of the matrix 110 can be liquefiable at a temperature of up to a maximum of approximately 600° C.

Alternatively or additionally, the matrix 110 may include or be formed from one of the following substances: a silicone, for example a polydimethyl-siloxane, polydimethylsiloxane/polydiphenylsiloxane and/or a derivative thereof; a silazane, an epoxy, a polyacrylate, a polycarbonate or the like, for example a silicone hybrid, a silicone-epoxy hybrid.

The cladding 108 may include for example a first cladding structure 108-2 and a second cladding structure 108-1. By way of example, the first cladding structure 108-1 can extend parallel to the second cladding structure 108-2.

The core 122 and the cladding 108 can be formed with respect to one another in such a way that the interface between core 122 and cladding structures 108-1/2 is reflective for at least part of the electromagnetic radiation 116. The waveguide 106 is formed in such a way that part 120 of the electromagnetic radiation 114 is guided from the optoelectronic structure 102 to the measuring structure 104.

In various embodiments, the optoelectronic component 100 can be formed in such a way that the major portion of the electromagnetic radiation 114 which is emitted by the optoelectronic structure 102 can be coupled out from the optoelectronic component with respect to the waveguide 106. In other words: the optoelectronic component 100 can be formed in such a way that the electromagnetic radiation 114 substantially emitted by the optoelectronic structure 102 is emitted through the second cladding structure 108-2, the core 122 and the first cladding structure 108-1. By way of example, the first cladding structure 108-1 and the second cladding structure 108-2 can be formed from a material that is at least translucent with respect to the electromagnetic radiation 114. In other words: the waveguide 106 should be formed in such a way that substantially the entire proportion of the electromagnetic radiation 114 is emitted from the optoelectronic component 100, and a small proportion of electromagnetic radiation 114 is guided through the waveguide 106 to the measuring structure 104. The small proportion of electromagnetic radiation 120 which passes as far as the measuring structure 104 can be sufficient to determine the properties of the emitted electromagnetic radiation 114. As a result, if appropriate, a readjustment of the current properties and emission properties of the optoelectronic structure 102 can be made possible.

The first cladding structure 108-1 can be identical to or different than the second cladding structure 108-2. In one embodiment, the first cladding structure 108-1 can have a lower refractive index than the second cladding structure 108-2.

The core 122 of the waveguide 106 can have a thickness D. The scattering centers 112 can have an average free path length d from one another. The average free path length can also be designated as average distance for the electromagnetic radiation 116 between the scattering centers 112, that is to say as the distance between the scattering centers 112 in which the electromagnetic radiation 116 is not scattered at the scattering centers 112.

In one configuration, the scattering centers can be formed and/or distributed in the matrix in such a way that the average free path length of the electromagnetic radiation in relation to the thickness of the waveguide is in a ratio of approximately 0.1 to approximately 10.0. In other words: the average distance d in relation to the thickness D can have a ratio in a range of approximately 0.1 to approximately 10.0.

If the average free path length d of the electromagnetic radiation is greater than the thickness D of the core of the waveguide 106, the quantity of electromagnetic radiation coupled into the waveguide can decrease, such that the proportion of electromagnetic radiation which is guided in the waveguide to the measuring structure 104 is too small to be able to be measured by the measuring structure 104. By way of example, in the case of an excessively low concentration and/or unsuitable distribution of the scattering centers, as a result a sensor could be addressed with light having an excessively low intensity.

If the average free path length d of the electromagnetic radiation is less than the thickness D of the core of the waveguide 106, too much electromagnetic radiation can be coupled in or remain in the waveguide, such that the efficiency of the optoelectronic component decreases.

The average free path length d can be set by means of the concentration of the scattering centers 112 at the core 122 of the waveguide 106 with respect to the thickness D thereof and their distribution in the matrix 110. By way of example, the scattering centers 112 can be distributed homogeneously in the matrix 110.

Alternatively, the scattering centers 112 can be distributed in the core in a structured fashion. By way of example, the core 122 may include a first region having a first concentration of scattering centers 112 and at least one second region having a second concentration of scattering centers 112. The first concentration can be different, for example higher, than the second concentration. Alternatively or additionally, the first region can have a first distribution of scattering centers 112 and the second region can have a second distribution of scattering centers 112. By way of example, the first distribution can be a homogeneous distribution of scattering centers 112 and the second distribution can be a scattering center concentration having a gradient. The first region and the at least one second region can be arranged one above another or alongside one another in the waveguide 106. By way of example, a first region can be in the region of the measuring structure 104 in the waveguide 106 and at least one second region can be in the region of the optoelectronic structure 102 in the waveguide 106, wherein the first region has for example a higher density of scattering centers than the second region, that is to say that, for example in the case of a homogeneous distribution of the scattering centers in the first region and in the second region, the first region has a higher concentration of scattering centers than the second region.

Depending on the concrete arrangement of the measuring structure 104 with respect to the optoelectronic structure 102, it is possible, by means of one of the above-mentioned structured arrangements of the scattering centers 112 in the matrix 110, to guide a waveguiding of the electromagnetic radiation 116 from—relative to the optoelectronic structure 102—the entire region of the waveguide 106 as far as the measuring structure 104.

For the case where the scattering centers 112 are arranged in layers, the average free path length d can be reduced relative to a homogeneous distribution of the scattering centers 112 in the matrix 110, for example can be reduced locally in the region of the scattering centers.

Furthermore, the degree of scattering of the electromagnetic radiation and thus the waveguiding can be set by means of the difference in refractive index between scattering centers 112 and matrix 110.

Furthermore, the degree of scattering can be set by means of the configuration of the scattering centers 112, for example their average dimensioning and/or surface shape with respect to an electromagnetic radiation.

In various embodiments, the waveguide 106 may include a coupling-out structure 118 in the region of the measuring structure 104, as is shown for example in greater detail in the description below.

In various embodiments, the optoelectronic structure 102 can be electrically and/or physically isolated from the measuring structure 104 or can be connected to the latter.

In various embodiments, the optoelectronic structure 102 and/or the measuring structure 104 can be arranged, for example formed, on or above the waveguide 106. In one embodiment, the optoelectronic structure 102 and/or the measuring structure 104 can be adhesively bonded on the waveguide 106, for example by means of an adhesive that is at least translucent with respect to the electromagnetic radiation 116, 120.

In one configuration, the optoelectronic structure 102, the measuring structure 104 and/or the waveguide 106 can be formed as a layer stack. The waveguide can be formed for example as a covering body of the optoelectronic structure and/or the measuring structure. The covering body can be for example a carrier, a hermetically impermeable substrate, a covering and/or an encapsulation structure.

In one embodiment, the optoelectronic structure 102 and the measuring structure 104 can be arranged alongside one another on the waveguide 106. Alternatively or additionally, the measuring structure 104 can be arranged laterally with respect to the optoelectronic structure 102, for example on the waveguide 106.

In various embodiments, it is possible by means of the incorporation of a waveguide 106 under the optoelectronic structure 102, in which the light 114 emitted by the optoelectronic structure 102 is scattered and an integration of the brightness—and thus also of the color of the emitted light 114—is performed over the entire optically active area of the optoelectronic structure 102. This light is then guided to the measuring structure 104, for example a sensor. Light from the entire active area of an OLED can thus be collected, rather than only from selected locations, as is done conventionally. Illustratively, integration is performed over the entire optically active area of the OLED by means of the arrangement of the scattering centers 112 in the matrix 110 of the core 122 of the waveguide 106.

Figure 2:
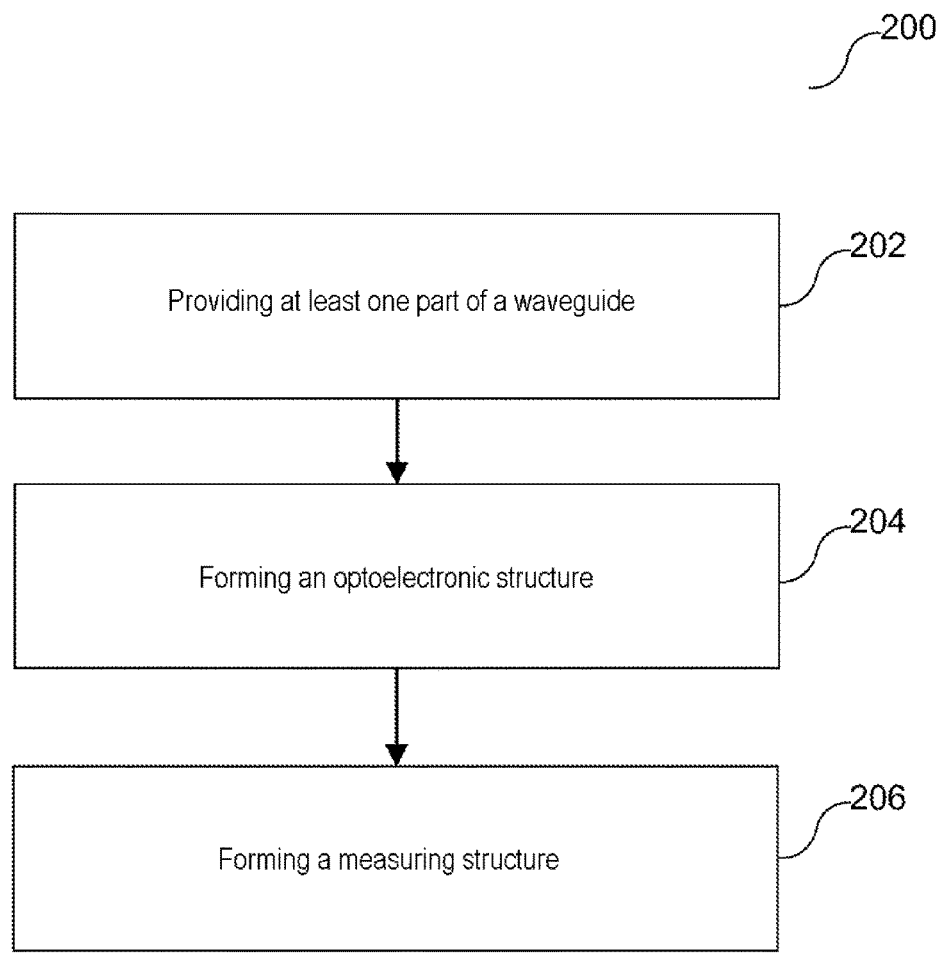
FIG. 2 shows a schematic illustration concerning a method for producing an optoelectronic component in accordance with various embodiments.

In various embodiments, a method 200 for producing an optoelectronic component 100 is provided—for example illustrated in FIG. 2.

The method 200 may include providing 202 at least one part of a waveguide 106 formed for guiding an electromagnetic radiation. In various embodiments, providing the waveguide 106 may include at least partly forming the waveguide 106.

In various embodiments, an optoelectronic structure 102 and a measuring structure 104 can be formed in a manner optically coupled to the waveguide 106.

The waveguide 106 can be formed as a covering body of the optoelectronic structure 102 and/or of the measuring structure 104. A covering body is formed for covering another body. By way of example, the covering body can be a carrier 302, a hermetically impermeable substrate 326 or a covering 324, see the description below, for example. The optoelectronic structure 102 and the measuring structure 104 can be arranged for example alongside one another on the waveguide 106. Alternatively or additionally, the measuring structure 104 can be arranged laterally with respect to the optoelectronic structure 102 on the waveguide 106.

In various embodiments, the waveguide 106 can be formed with a core 122 and a cladding 108 in such a way that the cladding 108 covers the core 122 along the direction of propagation of the electromagnetic radiation. The core 122 can be formed with a matrix 110 in which scattering centers 112 are distributed. The scattering centers 112 can be distributed in the matrix in such a way that part of the electromagnetic radiation is guided from the optoelectronic structure to the measuring structure 104. The waveguide 106 can be formed in such a way that the scattering centers 112 have a difference in the refractive index with respect to the electromagnetic radiation in relation to the refractive index of the matrix of greater than approximately 0.05. The cladding 108 can be formed such that it is at least translucent with respect to the electromagnetic radiation. The optoelectronic structure 102 and/or the measuring structure 104 can be formed with a covering body. The covering body can be formed at least as a part of the waveguide 106, for example as at least one part of the cladding 108 of the waveguide 106.

The scattering centers 112 can be formed as particles and/or cavities. The scattering centers 112 can be distributed homogeneously in the matrix at least in a region of the waveguide 106.

The scattering centers 112 formed in a particulate fashion may include or be formed from an inorganic substance or an inorganic substance mixture. The scattering centers 112 may include or be formed from, for example, one of the following substances, substance mixtures or stoichiometric compounds: $TiO_2$, $CeO_2$, $Bi_2O_3$, $ZnO$, $SnO_2$, $Al_2O_3$, $SiO_2$, $Y_2O_3$, $ZrO_2$, phosphors, colorants, and glass particles, metallic nanoparticles.

The scattering centers 112 can have a curved surface or can be formed in this way, for example in a manner similar or identical to an optical lens. By way of example, the scattering centers 112 can have one of the following geometrical shapes and/or a part of one of the following geometrical shapes or can be formed in this way: spherical, aspherical, for example prismatic, ellipsoid, hollow, laminar or rod-shaped.

The scattering centers 112 can have an average diameter in a range of approximately 0.02 µm to approximately 10 µm or can be formed in this way, for example in a range of approximately 0.1 µm to approximately 1 µm.

In various embodiments, the waveguide 106 can be formed with at least a first type of scattering centers 112 and a second type of scattering centers 112, wherein the first type and the second type of scattering centers 112 differ in at least one property, for example in the average dimensioning (average grain size) of the scattering centers 112, the shape and/or the refractive index with respect to the electromagnetic radiation.

The matrix can be formed with a refractive index of greater than approximately 1.7 with respect to the electromagnetic radiation. The matrix can have said refractive index for example at least along a direction of propagation of the electromagnetic radiation, for example by virtue of the matrix being formed such that it is at least partly crystalline, for example with an optical anisotropy. Alternatively, the matrix can be formed in an amorphous fashion.

The matrix may include or be formed from a molding material and/or a potting material.

In various embodiments, the matrix may include or be formed from one of the following substances or substance mixtures from the group of glass systems: PbO-containing systems, for example $PbO-B_2O_3$, $PbO-SiO_2$, $PbO-B_2O_3-SiO_2$, $PbO-B_2O_3-ZnO_2$, $PbO-B_2O_3-Al_2O_3$; and/or $Bi_2O_3$-containing systems, for example $Bi_2O_3-B_2O_3$, $Bi_2O_3-B_2O_3-SiO_2$, $Bi_2O_3-B_2O_3-ZnO$, $Bi_2O_3-B_2O_3-ZnO-SiO_2$. Alternatively or additionally, the matrix may include or be formed from one of the following substances or substance mixtures: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides. Alternatively or additionally, the matrix may include or be formed from one of the following substances or substance mixtures: Ce, Fe, Sn, Ti, Pr, Eu and/or V compounds.

Forming the waveguide 106 may include glass melting, for example. The glass melting process can be thermal liquefaction, i.e. melting, of a glass. After the glass melting process, the glass can be powdered, applied to a carrier in the form of coatings, and subsequently vitrified by means of a thermal treatment. The substance or the substance mixture of the matrix can be selected for example in such a way that it becomes liquefiable at a temperature of up to a maximum of approximately 600° C.

Alternatively or additionally, the matrix may include or be formed from one of the following substances: a silicone, for example a polydimethylsiloxane, polydi-methylsiloxane/polydiphenylsiloxane and/or a derivative thereof; a silazane, an epoxy, a polyacrylate, a polycarbonate or the like, for example a silicone hybrid, a silicone-epoxy hybrid.

In various embodiments, the optoelectronic component 100 can be formed in such a way that the major portion of the electromagnetic radiation 116 which is emitted by the optoelectronic structure 102 can be coupled out from the optoelectronic component with respect to the waveguide 106. In other words: the major portion of the electromagnetic radiation 116 which is emitted and/or absorbed by the optoelectronic structure 102 can penetrate through the waveguide 106 and be transmitted.

The scattering centers 112 can be formed and/or distributed in the matrix in such a way that the average free path length d of the electromagnetic radiation 116 with respect to the thickness D of the core 122 of the waveguide 106 is in a range of approximately 0.1 to approximately 10.

Furthermore, the method may include forming 204 an optoelectronic structure 102 for providing the electromagnetic radiation. The optoelectronic structure 102 can be formed for example with a first electrode 310, a second electrode 314 and an organic functional layer structure 312 between the first electrode 310 and the second electrode 314—see description below, for example. The organic functional layer structure 312 can be formed for example for converting an electric current into an electromagnetic radiation and/or for converting an electromagnetic radiation into an electric current.

Furthermore, the method may include forming 206 a measuring structure 104 for measuring the electromagnetic radiation.

In various embodiments, the measuring structure 104 may include an optoelectronic structure or be formed in this way, for example as a photodiode or a photodetector.

In one embodiment, the measuring structure 104 can be formed with a third electrode, a fourth electrode and a second organic functional layer structure between the third electrode and the fourth electrode, wherein the second organic functional layer structure is formed at least for converting an electromagnetic radiation into an electric current. The third electrode can be formed in the same structure as the first electrode 310, for example can be formed as one (common) electrode. Alternatively or additionally, the fourth electrode can be formed in the same structure as the second electrode 314, for example can be formed as one electrode. Alternatively or additionally, the second organic functional layer structure can be formed in the same structure as the organic functional layer structure of the optoelectronic structure, for example can be formed as one organic functional layer structure. At least one of the electrodes and/or the second organic functional layer structure of the measuring structure 104 should be formed in a manner electrically insulated from the electrodes and/or the organic functional layer structure of the optoelectronic structure 102. An electrical insulation can be realized for example by means of a low transverse conductivity or an opening of a region of an electrically conductive layer.

In one embodiment, the measuring structure 104 can be formed with the same layer stack as the optoelectronic structure 102.

In various embodiments, the method can furthermore include forming a coupling-out structure 118 in the beam path of the electromagnetic radiation 116 in the waveguide 106 and the measuring structure 104, for example in the region of the measuring structure 104. The coupling-out structure can be formed in such a way that at least part of the electromagnetic radiation which can be guided in the waveguide is diverted into the measuring structure.

In one embodiment, the coupling-out structure 118 can be formed for example with a mirror structure, wherein the mirror structure is at least reflective for at least part of the electromagnetic radiation guided in the waveguide 106, for example by virtue of a part of the waveguide 106 being reflectively coated or formed in a reflective fashion.

Alternatively or additionally, the coupling-out structure 118 can be formed with scattering centers 112 distributed in a matrix 110. In one embodiment, the coupling-out structure 118 can be formed in such a way that the proportion and/or the type of scattering centers 112 in the coupling-out structure 118, for example in the waveguide 106 in the region of the measuring structure 104, is different than in the region of the optoelectronic structure 102.

Alternatively or additionally, the coupling-out structure 118 can be formed with or include a microlens array 404. Alternatively or additionally, the coupling-out structure 118 can be formed with or include a structured interface of the waveguide 106. The structured interface can be formed for example by means of roughening one of the interfaces or forming a pattern at one of the interfaces of the coupling-out structure 118. The microlenses and/or the interface roughness can act for example as scattering centers 112, for example for increasing the coupling-in of light into the measuring structure 104 and/or a coupling-out of light from the waveguide 106.

Alternatively or additionally, the coupling-out structure 118 can be formed with or include an optical grating, wherein the grating is formed as a structured layer having regions having a low refractive index with respect to at least part of the electromagnetic radiation guided in the waveguide.

In various embodiments, the optoelectronic component 100 can be formed as a surface component. Additionally or alternatively, the optoelectronic component 100 can be formed as an organic optoelectronic component, for example as an organic photodetector, an organic solar cell and/or an organic light emitting diode.

Figure 3:
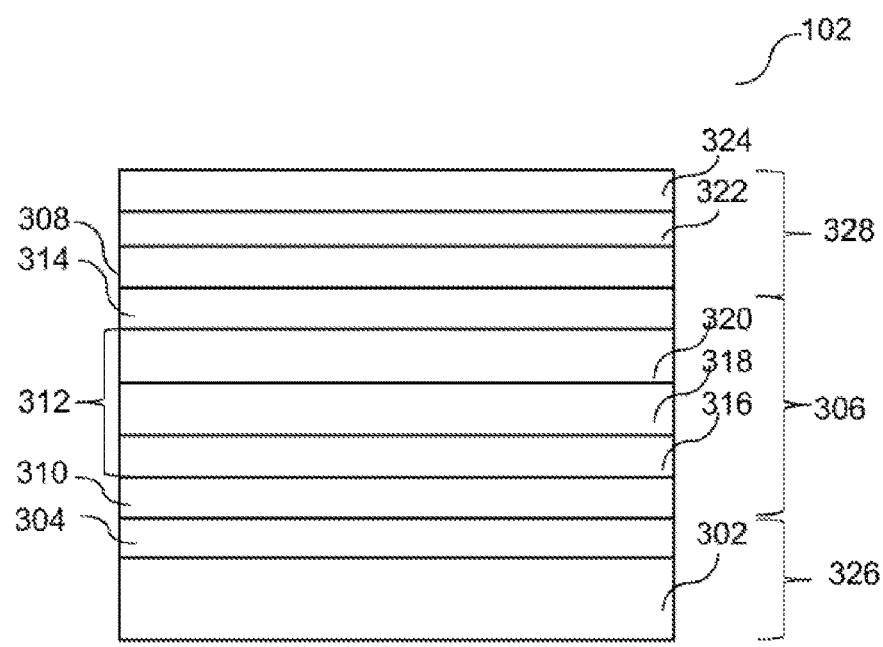
FIG. 3 shows a schematic illustration of an optoelectronic structure of an optoelectronic component in accordance with various embodiments.

In various embodiments, the optoelectronic structure 102 may include a hermetically impermeable substrate 326, an active region 306 and an encapsulation structure 328 or can be formed in this way—illustrated in FIG. 3.

The hermetically impermeable substrate 326 may include a carrier 302 and a first barrier layer 304 or be formed in this way.

The active region 306 is an electrically active region 306 and/or an optically active region 306. The active region 306 is for example the region of the optoelectronic component 100 and/or of the optoelectronic structure 102 in which electric current for the operation of the optoelectronic component 100 and/or of the optoelectronic structure 102 flows and/or in which electromagnetic radiation is generated and/or absorbed.

The electrically active region 306 may include a first electrode 310, an organic functional layer structure 312 and a second electrode 314 or can be formed in this way.

The organic functional layer structure 312 may include one, two or more functional layer structure units and one, two or more intermediate layer structure(s) between the layer structure units or can be formed in this way. The organic functional layer structure 312 may include for example a first organic functional layer structure unit 316, an intermediate layer structure 318 and a second organic functional layer structure unit 320 or can be formed in this way.

The encapsulation structure 328 may include a second barrier layer 308, a close connection layer 322 and a cover 324 or can be formed in this way.

The carrier 302 may include or be formed from glass, quartz and/or a semiconductor material or can be formed in this way. Furthermore, the carrier may include or be formed from a plastics film or a laminate including one or including a plurality of plastics films or can be formed in this way. The plastic may include or be formed from one or a plurality of polyolefins (for example high or low density polyethylene (PE) or polypropylene (PP)) or can be formed in this way. Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN) or can be formed in this way.

The carrier 302 may include or be formed from a metal, for example copper, silver, gold, platinum, iron, for example a metal compound, for example steel, or can be formed in this way.

The carrier 302 can be embodied as opaque, translucent or even transparent.

The carrier 302 can be a part of a mirror structure or form the latter.

The carrier 302 can have a mechanically rigid region and/or a mechanically flexible region or be formed in this way, for example as a film.

The carrier 302 can be formed as a waveguide 106 or part of the waveguide 106, for example as a second cladding structure 108-2. In other words: the waveguide 106 can be formed as a substrate 326, a carrier 302 or an encapsulation structure 328 of the optoelectronic structure 102. Alternatively, the carrier 302, the substrate 326 or the encapsulation structure 328 can be connected to the waveguide 106, for example by means of an at least partly translucent adhesive, see the description below, for example.

The first barrier layer 304 may include or be formed from one of the following materials or can be formed in this way: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 304 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 304 including a plurality of partial layers, all the partial layers can be formed by means of an atomic layer deposition method. A layer sequence including only ALD layers can also be designated as a "nanolaminate".

In the case of a first barrier layer 304 including a plurality of partial layers, one or a plurality of partial layers of the first barrier layer 304 can be deposited by means of a different deposition method than an atomic layer deposition method, for example by means of a vapor deposition method.

The first barrier layer 304 can have a layer thickness of approximately 0.1 nm (one atomic layer) to approximately 1000 nm or can be formed in this way, for example a layer thickness of approximately 10 nm to approximately 100 nm in accordance with one configuration, for example approximately 40 nm in accordance with one configuration.

The first barrier layer 304 may include one or a plurality of high refractive index materials or can be formed in this way, for example one or a plurality of material(s) having a high refractive index, for example having a refractive index of at least 2.

Furthermore, it should be pointed out that, in various embodiments, a first barrier layer 304 can also be entirely dispensed with, for example for the case where the carrier 302 is formed in a hermetically impermeable fashion, for example includes or is formed from glass, metal, metal oxide.

The first electrode 304 can be formed as an anode or as a cathode.

The first electrode 310 may include or be formed from one of the following electrically conductive materials or can be formed in this way: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 310 composed of a metal or including a metal may include or be formed from one of the following materials or can be formed in this way: Ag, Pt, Au, Mg, Al, Ba, In, Ca, Sm or Li, and compounds, combinations or alloys of these materials. The first electrode 310 may include as transparent conductive oxide one of the following materials or can be formed in this way: for example metal oxides: for example zinc oxide, tin oxide, cadmium oxide, titanium oxide, indium oxide, or indium tin oxide (ITO). Alongside binary metal-oxygen compounds, such as, for example, ZnO, SnO$_2$, or In$_2$O$_3$, ternary metal-oxygen compounds, such as, for example, AlZnO, Zn$_2$SnO$_4$, CdSnO$_3$, ZnSnO$_3$, MgIn$_2$O$_4$, GaInO$_3$, Zn$_2$In$_2$O$_5$ or In$_4$Sn$_3$O$_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 310 may include a layer or a layer stack of a plurality of layers of the same material or different materials or can be formed in this way. The first electrode 310 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 304 can have for example a layer thickness in a range of 10 nm to 500 nm or can be formed in this way, for example of less than 25 nm to 250 nm, for example of 50 nm to 100 nm.

The first electrode 310 can have a first electrical terminal or can be formed in this way, to which a first electrical potential can be applied. The first electrical potential can be provided by an energy source, for example a current source or a voltage source. Alternatively, the first electrical potential can be applied to an electrically conductive carrier 302 and the first electrode 310 can be electrically supplied indirectly through the carrier 302. The first electrical potential can be for example the ground potential or some other predefined reference potential.

FIG. 3 illustrates an optoelectronic component 102 including a first organic functional layer structure unit 316 and a second organic functional layer structure unit 320. In various embodiments, however, the organic functional layer structure 312 can also include only one or more than two organic functional layer structures or can be formed in this way, for example 3, 4, 5, 6, 7, 8, 9, 10, or even more, for example 15 or more, for example 70.

The first organic functional layer structure unit 316 and the optionally further organic functional layer structures can be formed identically or differently, for example include an identical or different emitter material or can be formed in this way. The second organic functional layer structure unit 320, or the further organic functional layer structure units can be formed like one of the below-described configurations of the first organic functional layer structure unit 316.

The first organic functional layer structure unit 316 may include a hole injection layer, a hole transport layer, an emitter layer, an electron transport layer and an electron injection layer or can be formed in this way.

In an organic functional layer structure unit 312, one or a plurality of the layers mentioned can be provided, wherein identical layers can have a physical contact or can be formed in this way, can be only electrically connected to one another or can even be formed in a manner electrically insulated from one another, for example can be formed alongside one another. Individual layers of the layers mentioned can be optional.

A hole injection layer can be formed on or above the first electrode 310. The hole injection layer may include or be formed from one or a plurality of the following materials or can be formed in this way: HAT-CN, Cu(I)pFBz, MoO$_x$, WO$_x$, VO$_x$, ReO$_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis-(naphthalen-2-yl)-N, N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N, N'-bis(phenyl)-9,9-dimethylfluorene); DPFL-TPD (N,N'-bis (3-methylphenyl)-N,N'-bis-(phenyl)-9,9-diphenylfluorene); DPFL-NPB (N,N'-bis-(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N, N'-bisnaphthalen-2-yl-N,N'-bisphenyl-amino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)phenyl] cyclohexane; 2,2',7,7'-tetra(N,N-ditolyl) aminospirobifluorene; and/or N,N,N',N'-tetranaphthalen-2-ylbenzidine.

The hole injection layer can have a layer thickness or can be formed in this way in a range of approximately 10 nm to approximately 1000 nm, for example in a range of approximately 30 nm to approximately 102 nm, for example in a range of approximately 50 nm to approximately 200 nm.

A hole transport layer can be formed on or above the hole injection layer. The hole transport layer may include or be formed from one or a plurality of the following materials or can be formed in this way: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis(phenyl)benzidine); spiro TPD (N,N'-bis(3-methyl-phenyl)-N,N'-bis(phenyl)benzidine); spiro-NPB (N,N'-bis(naphthalen-1-yl)-N,N'-bis(phenyl) spiro); DMFL-TPD (N,N'-bis(3-methylphenyl)-N,N'-bis (phenyl)-9,9-dimethylfluorene); DMFL-NPB (N,N'-bis (naphthalen-1-yl)-N,N'-bis(phenyl)-9,9-dimethylfluorene); DPFL-TPD (N,N'-bis(3-methylphenyl)-N,N'-bis(phenyl)-9, 9-diphenylfluorene); DPFL-NPB (N,N'-bis(naphthalen-1-yl)-N,N'-bis-(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bis-phenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N, N-bis(biphenyl-4-yl)amino]-9,9-spirobifluorene; 2,2'-bis(N, N-diphenylamino)-9,9-spirobifluorene; di[4-(N,N-ditolylamino)phenyl]cyclohexane; 2,2',7,7'-tetra-(N,N-ditolyl)aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness or can be formed in this way in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 316, 320 may include in each case one or a plurality of emitter layers or can be formed in this way, for example including fluorescent and/or phosphorescent emitters.

An emitter layer may include or be formed from organic polymers, organic oligomers, organic monomers, organic small, non-polymeric molecules ("small molecules") or a combination of these materials or can be formed in this way.

The optoelectronic structure 102 may include or be formed from one or a plurality of the following materials in an emitter layer or can be formed in this way: organic or organometallic compounds such as derivatives of polyfluorene, polythiophene and poly-phenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)-amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spincoating method.

The emitter materials can be embedded in a suitable manner in a matrix material, for example a technical ceramic or a polymer, for example an epoxy; or a silicone.

In various embodiments, the emitter layer can have a layer thickness or can be formed in this way in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red) or can be formed in this way. Alternatively, the emitter layer may include a plurality of partial layers which emit light of different colors, or can be formed in this way. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 316 may include one or a plurality of emitter layers embodied as hole transport layer or can be formed in this way.

Furthermore, the organic functional layer structure unit 316 may include one or a plurality of emitter layers embodied as electron transport layer or can be formed in this way.

An electron transport layer can be formed, for example deposited, on or above the emitter layer.

The electron transport layer may include or be formed from one or a plurality of the following materials or can be formed in this way: NET-18; 2,2',2"-(1,3,5-benzinetriyl)tris (1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f] [1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness or can be formed in this way in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials or can be formed in this way: NDN-26, MgAg, Cs$_2$CO$_3$, Cs$_3$PO$_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di-(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)-borane; 1-methyl-2-(4-(naphthalen-2-yl)phenyl)-1H-imidazo[4,5-f] [1,10] phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit. The electron injection layer can have a layer thickness or can be formed in this way in a range of approximately 5 nm to approximately 200 nm, for example in a range of approximately 20 nm to approximately 50 nm, for example approximately 30 nm.

In the case of an organic functional layer structure 312 including two or more organic functional layer structure units 316, 320, the second organic functional layer structure unit 320 can be formed above or alongside the first functional layer structure units 316. An intermediate layer structure 318 can be formed electrically between the organic functional layer structure units 316, 320.

In various embodiments, the intermediate layer structure 318 can be formed as an intermediate electrode 318, for example in accordance with one of the configurations of the first electrode 310. An intermediate electrode 318 can be electrically connected to an external voltage source. The external voltage source can provide a third electrical potential, for example at the intermediate electrode 318. However, the intermediate electrode 318 can also have no external electrical connection or can be formed in this way, for example by the intermediate electrode having a floating electrical potential.

In various embodiments, the intermediate layer structure 318 can be formed as a charge generating layer structure 318 (charge generation layer CGL). A charge generating layer structure 318 may include one or a plurality of electron-conducting charge generating layer(s) and one or a plurality of hole-conducting charge generating layer(s) or can be formed in this way. The electron-conducting charge generating layer(s) and the hole-conducting charge generating layer(s) can be formed in each case from an intrinsically conductive substance or a dopant in a matrix. The charge generating layer structure 318 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 318 can furthermore have a diffusion barrier between adjacent layers or can be formed in this way.

Each organic functional layer structure unit 316, 320 can have or be formed with for example a layer thickness of a maximum of approximately 3 µm, for example a layer thickness of a maximum of approximately 1 µm, for example a layer thickness of a maximum of approximately 102 nm.

The optoelectronic structure 102 can optionally include further organic functional layers or can be formed in this way, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 102.

The second electrode 314 can be formed on or above the organic functional layer structure 312 or, if appropriate, on or above the one or the plurality of further organic functional layer structures and/or organic functional layers.

The second electrode 314 can be formed in accordance with one of the configurations of the first electrode 310, wherein the first electrode 310 and the second electrode 314 can be formed identically or differently. The second electrode 314 can be formed as an anode, that is to say as a hole-injecting electrode, or as a cathode, that is to say as an electron-injecting electrode.

The second electrode 314 can have a second electrical terminal or can be formed in this way, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V, or can be formed in this way.

The second barrier layer 308 can be formed on the second electrode 314.

The second barrier layer 308 can also be referred to as thin film encapsulation (TFE). The second barrier layer 308 can be formed in accordance with one of the configurations of the first barrier layer 304.

Furthermore, it should be pointed out that, in various embodiments, a second barrier layer 308 can also be entirely dispensed with. In such a configuration, the optoelectronic structure 102 may include for example a further encapsulation structure or can be formed in this way, as a result of which a second barrier layer 308 can become optional, for example a cover 324, for example a cavity glass encapsulation or metallic encapsulation.

Furthermore, in various embodiments, in addition, one or a plurality of coupling-in/-out layers can also be formed in the optoelectronic structure 102, for example an external coupling-out film on or above the carrier 302 (not illustrated) or an internal coupling-out layer (not illustrated) in the layer cross section of the optoelectronic structure 102. The coupling-in/-out layer may include a matrix and scattering centers distributed therein or can be formed in this way, wherein the average refractive index of the coupling-in/-out layer is greater or less than the average refractive index of the layer from which the electromagnetic radiation is provided. Furthermore, in various embodiments, in addition, one or a plurality of antireflection layers (for example combined with the second barrier layer 308) can be provided in the optoelectronic structure 102.

In various embodiments, a close connection layer 322, for example composed of an adhesive or a lacquer, can be provided on or above the second barrier layer 308. By means of the close connection layer 322, a cover 324 can be closely connected, for example adhesively bonded, on the second barrier layer 308.

A close connection layer 322 composed of a transparent material may include or be formed as for example particles which scatter electromagnetic radiation, for example light-scattering particles. As a result, the close connection layer 322 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 322, for example air bubbles, acrylate, or hollow glass beads. Furthermore, by way of example, metallic nanoparticles, metals such as gold, silver, iron nanoparticles, or the like can be provided as light-scattering particles.

The close connection layer 322 can have a layer thickness of greater than 1 µm, for example a layer thickness of a plurality of µm, or can be formed in this way. In various embodiments, the close connection layer 322 may include or be a lamination adhesive or can be formed in this way.

The close connection layer 322 can be designed in such a way that it includes an adhesive having a refractive index that is less than the refractive index of the cover 324. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 312, for example in a range of approximately 1.7 to approximately 2.0. Furthermore, a plurality of different adhesives can be provided which form an adhesive layer sequence.

In various embodiments, between the second electrode 314 and the close connection layer 322, an electrically insulating layer (not shown) can also be applied, for example SiN, for example having a layer thickness in a range of approximately 102 nm to approximately 1.5 µm, for example having a layer thickness in a range of approximately 500 nm to approximately 1 in order to protect electrically unstable materials, during a wet-chemical process for example.

In various embodiments, a close connection layer 322 can be optional, for example if the cover 324 is formed directly on the second barrier layer 308, for example a cover 324 composed of glass that is formed by means of plasma spraying.

Furthermore, a so-called getter layer or getter structure, for example a laterally structured getter layer, can be arranged (not illustrated) on or above the electrically active region 306.

A cover 324 can be formed on or above the close connection layer 322. The cover 324 can be closely connected to the electrically active region 306 by means of the close connection layer 322 and can protect said region from harmful substances. The cover 324 can be for example a glass cover 324, a metal film cover 324 or a sealed plastics film cover 324. The glass cover 324 can be closely connected to the second barrier layer 308 or the electrically active region 306 for example by means of frit bonding (glass soldering/seal glass bonding) by means of a conventional glass solder in the geometric edge regions of the organic optoelectronic component 102.

The cover 324 and/or the close connection layer 322 can have a refractive index (for example at a wavelength of 633 nm) of 1.55 or can be formed in this way.

Figure 4A:
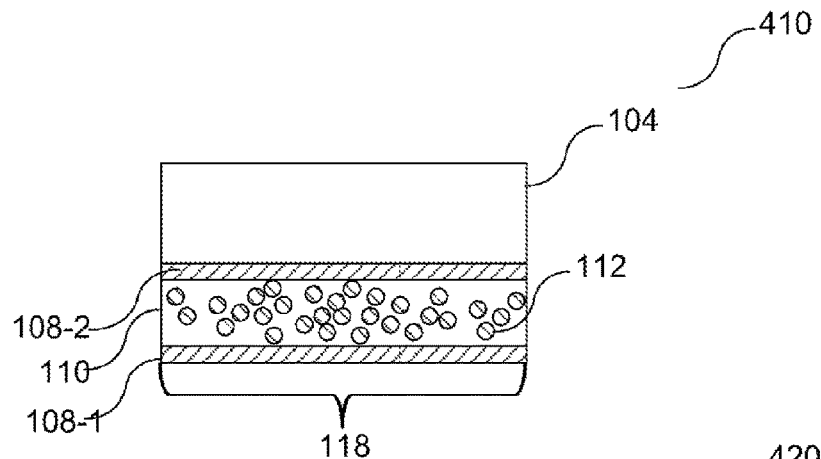
FIGS. 4A-4C show schematic illustrations of coupling-out structures of a waveguide of an optoelectronic component in accordance with various embodiments.
Figure 4B:
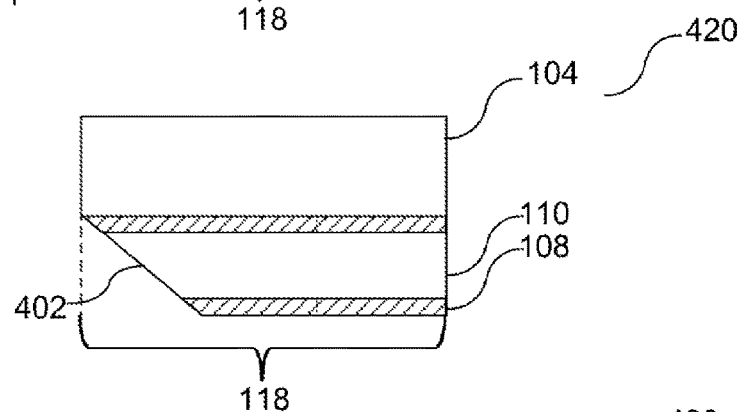
Figure 4C:
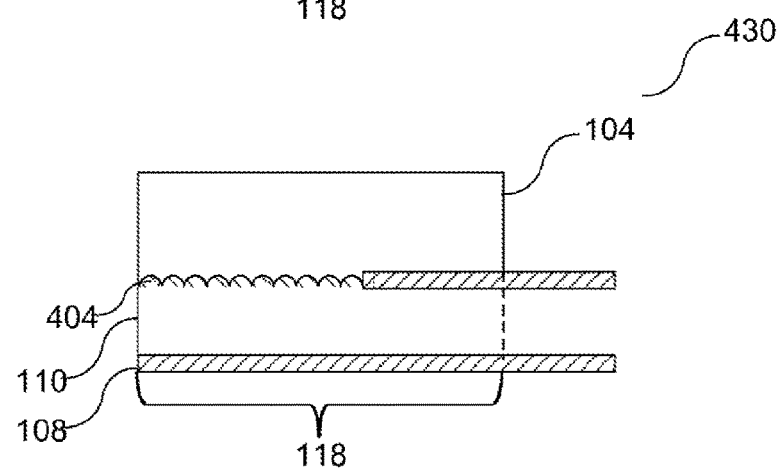

In one configuration, the optoelectronic component 100 can furthermore include a coupling-out structure 118—for example illustrated in FIGS. 4A-4C—in the beam path of the electromagnetic radiation 116 in the waveguide 106 and/or the measuring structure 104, for example in the region of the measuring structure 104. The coupling-out structure 118 can be formed in such a way that at least part of the electromagnetic radiation 116, 114 which can be guided in the waveguide 106 is diverted into the measuring structure 104.

In a configuration 410, the coupling-out structure 118 may include scattering centers 112 distributed in a matrix 110, illustrated in FIG. 4A. The coupling-out structure 118 can be formed in such a way that the proportion and/or the type of scattering centers 112 in the waveguide 106 are/is different in the region of the measuring structure 104 than in the region of the optoelectronic structure 102. By way of example, the coupling-out structure 118 may include more highly scattering and/or more scattering centers 112 than in the waveguide 106 in the region of the optoelectronic structure 102.

Alternatively or additionally, in a configuration 420 the coupling-out structure 118 may include a mirror structure 402 or can be formed in this way, wherein the mirror structure 402 is at least reflective for at least part of the electromagnetic radiation guided in the waveguide 106—for example illustrated in FIG. 4B. The mirror structure 402 can be formed such that it is specularly reflective or at least partly reflective, for example as a reflectively coated surface of the waveguide 106 and/or a reflective (total internal reflection) interface of the waveguide 106.

Alternatively or additionally, in a configuration 430 the coupling-out structure 118 can be formed with or include a structured interface 404 of the waveguide 106—for example illustrated in FIG. 4C. By way of example, the coupling-out structure 118 may include a microlens array or can be formed in this way.

Alternatively or additionally, the structured interface 404 can be formed for example by means of roughening one of the interfaces or forming a pattern at one of the interfaces of the coupling-out structure 118. The microlenses and/or the interface roughness can be understood for example as scattering centers, for example for increasing the coupling-in/out of light.

Alternatively or additionally, the coupling-out structure 118 can be formed as or include an optical grating, wherein the grating includes a structured layer having regions having a low refractive index with respect to at least part of the electromagnetic radiation guided in the waveguide.

Figure 5:
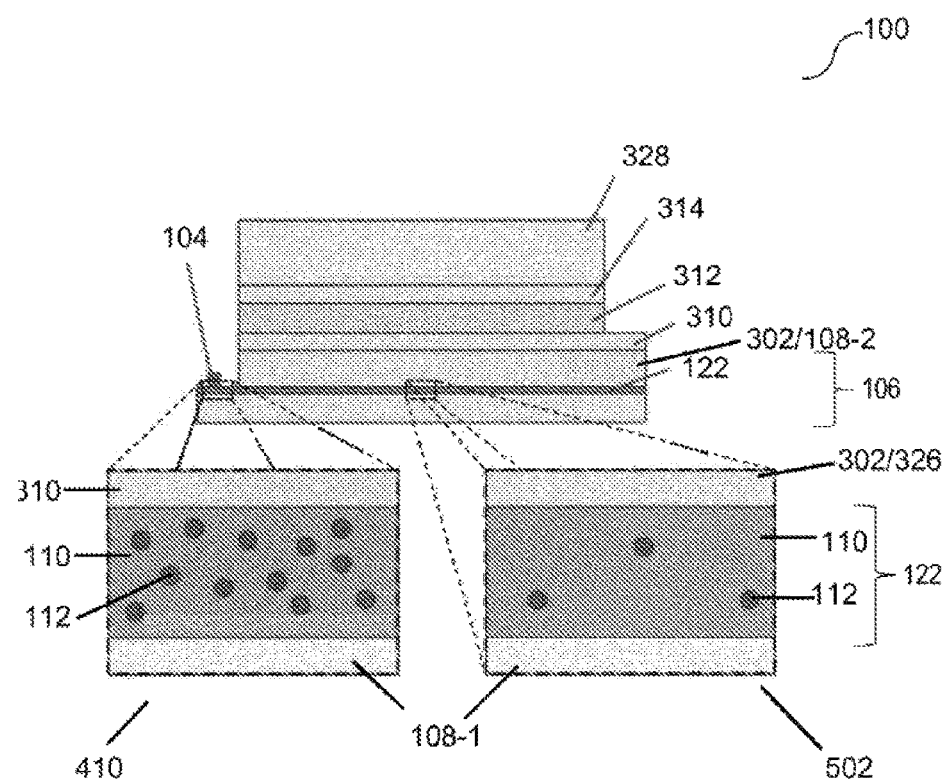
FIG. 5 shows a schematic illustration of one embodiment of an optoelectronic component.

In one embodiment—for example illustrated in FIG. 5—an optoelectronic structure 102, for example in accordance with one of the configurations described above, on the side of the hermetically impermeable substrate 326 or of the carrier 302 or on the side of an encapsulation structure 328 or cover 324 is optically connected to at least one part of a waveguide 106. The carrier 302 or the hermetically impermeable substrate 326 or the encapsulation structure 328 or the cover 324 can be part of the waveguide 106, for example the second cladding structure 108-2.

The core 122 of the waveguide 106 can be formed on that side of the second cladding structure 108-2 which faces away from the optoelectronic structure 102. The first cladding structure 108-1 of the waveguide 106 can be formed on that side of the core 120 which faces away from the optoelectronic structure 102. The first cladding structure can be for example a glass cover or an interface of the core 122 with respect to air.

In one embodiment, the optoelectronic structure 102 can be formed on or above the second cladding structure 108-2 and the measuring structure can be formed on or above the first cladding structure 108-1 and/or the core 122. Illustratively, the optoelectronic structure 102 and the measuring structure 104 can thus be formed on different areas of the waveguide 106.

The first cladding structure 108-1 and/or the second cladding structure 108-2 can have a lower refractive index than the core 122 of the waveguide 106 with respect to the electromagnetic radiation 114, 116 emitted and/or absorbed by the optoelectronic structure 102. By way of example, the core 122 can have a refractive index of greater than 1.52, and the first cladding structure 108-1 and the second cladding structure 108-2 can have a refractive index of less than or equal to 1.52. As a result, the electromagnetic radiation 116 can be reflected at the interface of the core 122 and the cladding structure 108-1/2 and guided as far as the measuring structure 104. The angle of incidence of the electromagnetic radiation on said interface can be varied or set by means of the scattering centers 112, for example. The proportion of electromagnetic radiation 120 which passes into the measuring structure 104 can thereby be set.

In the region of the measuring structure 104, the region of the first cladding structure 108-1 can be free of optoelectronic structure 102, for example, and instead a measuring structure 104 can be formed on or above the core 122.

The measuring structure 104 can be arranged on or above the core 122 of the waveguide 106. For example it can be formed thereon, for example deposited thereon; or can be applied thereon, for example adhesively bonded or soldered thereon. By way of example, the second cladding structure 108-2 in the region of the measuring structure 104 can be formed as a transparent electrically conductive layer, for example in accordance with one of the configurations of the first electrode 310. The measuring structure 102 for example in accordance with one of the configurations of the optoelectronic structure 102 can be formed thereon, wherein the transparent electrically conductively formed layer as second cladding structure 108-2 can be formed as an electrode of the measuring structure 102.

In one embodiment, the carrier 302, the hermetically impermeable substrate 326, the cover 324 or the encapsulation structure 328 can be connected to the core 122 of the waveguide 106, wherein the core 122 is exposed or is caused to be exposed in the region of the measuring structure 104. Afterward, the optoelectronic structure 102 can be formed substantially over the whole area on the carrier 302, the hermetically impermeable substrate 326, the cover 324 or the encapsulation structure 328. As a result, for example, at the same time as forming the optoelectronic structure 102, it is also possible to form the measuring structure 104 on the exposed core 122. In other words: in one embodiment, the measuring structure 104 can be formed simultaneously with the optoelectronic structure 102, for example from the same layer structure.

Independently thereof, a coupling-out structure 118 described above can be formed in the core 122 and/or at least one part of the cladding 108 in the region of the measuring structure. By way of example, the core 122 and/or at least one part of the cladding 108 can be structured. Alternatively or additionally, the core 122 and/or at least one part of the cladding 108 can be formed in an already structured fashion; by way of example, the core 122 can be formed with a higher concentration of scattering centers 112 in the region of the coupling-out structure 118 than in the region of the optoelectronic structure 102. As a result, for example, the ratio of free path length or average distance d between the scattering particles to the thickness D of the core can be reduced. As a result, for example, the angle of incidence at the interface between the core 122 and the second cladding structure 108-2 can be varied in such a way that the proportion of electromagnetic radiation reflected by said interface is smaller than in the region of the optoelectronic structure 102.

As a result, the proportion of electromagnetic radiation 120 which is coupled into the measuring structure 104 can be increased. In other words: in the coupling-in region 502 of the waveguide 106, i.e. the region of the waveguide 106 which is situated for example below the entire active area of the optoelectronic structure 102, the/a waveguide 106 has a lower concentration of scattering centers 112 than in the coupling-out region 118. This concentration in the coupling-in region 502 ensures that a small quantity of emitted electromagnetic radiation 116 is scattered into the waveguide 106 and is then transported in the waveguide 106 to the measuring structure 104, for example a sensor.

By means of this design it is possible to collect electromagnetic radiation from the entire active area of the optoelectronic structure 102. As a result, the signal of the measuring structure 104 can reproduce the present state of the optoelectronic structure 102 much more precisely than in the case of a simple positioning of the measuring structure on the carrier 302, the hermetically impermeable substrate 326, the cover 324 or the encapsulation structure 328.

In various embodiments, an optoelectronic component and a method for producing an optoelectronic component have been provided which make it possible to determine the color and brightness of the entire light emitted by an OLED in an integrated manner during the operation of the OLED.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   an optoelectronic structure formed for providing an electromagnetic radiation;
   a measuring structure formed for measuring the electromagnetic radiation; and
   a waveguide formed for guiding the electromagnetic radiation, wherein the optoelectronic structure and the measuring structure are optically coupled to the waveguide;
   wherein the waveguide comprises scattering centers distributed in a matrix, wherein the scattering centers are distributed in the matrix in such a way that a portion of the electromagnetic radiation provided from the optoelectronic structure is guided from the optoelectronic structure to the measuring structure,
   wherein the scattering centers are distributed in the waveguide in a structured fashion in such a way that a first region has a first concentration of scattering centers of homogeneous distribution and at least a second region has a second concentration of scattering centers of homogenous distribution,
   wherein the first region is arranged neighboring the measuring structure and the second region is arranged neighboring the optoelectronic structure,
   wherein the first concentration and the second concentration of scattering centers is above zero and the first concentration of scattering centers is higher than the second concentration of scattering centers,
   wherein the scattering centers are distributed in the matrix in such a way that an average free path length of the electromagnetic radiation relative to a thickness of the waveguide in each of the first region and the second region is in a ratio in a range of approximately 0.1 to approximately 10.0.

2. The optoelectronic component as claimed in claim 1, wherein the optoelectronic component is formed as an organic optoelectronic component.

3. The optoelectronic component as claimed in claim 1, further comprising:
   a coupling-out structure in the beam path of the electromagnetic radiation in the waveguide and the measuring structure, wherein the coupling-out structure is formed in such a way that at least part of the electromagnetic radiation guided in the waveguide is diverted into the measuring structure.

4. The optoelectronic component as claimed in claim 1, wherein the waveguide is formed as a covering body of the optoelectronic structure and/or of the measuring structure.

5. The optoelectronic component as claimed in claim 1, wherein the optoelectronic structure and the measuring structure are arranged alongside one another on the waveguide.

6. The optoelectronic component as claimed in claim 1, wherein the scattering centers are formed as cavities and/or are formed as particles and/or comprise or are formed from an inorganic substance or an inorganic substance mixture.

7. The optoelectronic component as claimed in claim 1, wherein the scattering centers are distributed in the waveguide in a structured fashion in such a way that the first region has a first distribution of scattering centers and the second region has a second distribution of scattering centers.

8. A method for producing an optoelectronic component, the method comprising:
   providing at least one part of a waveguide formed for guiding an electromagnetic radiation;
   forming an optoelectronic structure for providing the electromagnetic radiation; and
   forming a measuring structure for measuring the electromagnetic radiation;
   wherein the optoelectronic structure and the measuring structure are formed in a manner optically coupled to the waveguide;
   wherein the waveguide comprises scattering centers distributed in a matrix, wherein the scattering centers are distributed in the matrix in such a way that a portion of the electromagnetic radiation provided from the optoelectronic structure is guided from the optoelectronic structure to the measuring structure,
   wherein the scattering centers are distributed in the waveguide in a structured fashion in such a way that a first region has a first concentration of scattering centers of homogeneous distribution and at least a second region has a second concentration of scattering centers of homogeneous distribution,
   wherein the first region is arranged neighboring the measuring structure and the second region is arranged neighboring the optoelectronic structure, wherein the first concentration and the second concentration of scattering centers is above zero and the first concentration of scattering centers is higher than the second concentration of scattering centers,
   wherein the scattering centers are distributed in the matrix in such a wave that an average free path length of the electromagnetic radiation relative to a thickness of the waveguide in each of the first region and the second region is in a ratio in a range of approximately 0.1 to approximately 10.0.

9. The method as claimed in claim 8, wherein the optoelectronic component is formed as an organic optoelectronic component.

10. The method as claimed in claim 8, furthermore comprising: forming a coupling-out structure in the beam path of the electromagnetic radiation in the waveguide and the measuring structure, wherein the coupling-out structure is formed in such a way that at least a part of the electromagnetic radiation guided in the waveguide is deflected into the measuring structure.

11. The method as claimed in claim 8, wherein the waveguide is formed with a core and a cladding in such a way that the cladding covers the core along a direction of propagation of the electromagnetic radiation; and wherein the core is formed with the matrix and the scattering centers;
   wherein the optoelectronic structure and/or the measuring structure are/is formed with a covering body, wherein the covering body is formed at least as a part of the waveguide.

12. The method as claimed in claim 8, wherein the measuring structure is formed simultaneously with the optoelectronic structure.

* * * * *

UNITED STATES PATENT AND TRADEMARK OFFICE
CERTIFICATE OF CORRECTION

PATENT NO. : 10,312,290 B2
APPLICATION NO. : 15/113478
DATED : June 4, 2019
INVENTOR(S) : Thomas Wehlus Page 1 of 1

It is certified that error appears in the above-identified patent and that said Letters Patent is hereby corrected as shown below:

In the Claims

Column 30, Line 9, Claim 8: Please delete "in such a wave that an average free" and write -- "in such a way that an average free" -- in place thereof.

Signed and Sealed this
First Day of October, 2019

Andrei Iancu
*Director of the United States Patent and Trademark Office*